(12) United States Patent  
Qiu et al.

(10) Patent No.: US 8,314,421 B2  
(45) Date of Patent: Nov. 20, 2012

(54) THIN FILM TRANSISTORS AND CIRCUITS WITH METAL OXYNITRIDE ACTIVE CHANNEL LAYERS

(76) Inventors: Cindy X. Qiu, Brossars (CA); Yi-Chi Shih, Palos Verdes Estates, CA (US); Chunong Qiu, Brossard (CA); Ishiang Shih, Brossard (CA)

( * ) Notice: Subject to any disclaimer, the term of this patent is extended or adjusted under 35 U.S.C. 154(b) by 329 days.

(21) Appl. No.: 12/455,286

(22) Filed: Jun. 1, 2009

(65) Prior Publication Data

US 2010/0301343 A1    Dec. 2, 2010

(51) Int. Cl.  
*H01L 29/10* (2006.01)
(52) U.S. Cl. .......................................... 257/43
(58) Field of Classification Search ........... 257/43  
See application file for complete search history.

(56) References Cited

U.S. PATENT DOCUMENTS

| | | | |
|---|---|---|---|
| 6,849,853 B2* | 2/2005 | Ikeda et al. | 250/370.09 |
| 2007/0072439 A1* | 3/2007 | Akimoto et al. | 438/795 |
| 2007/0252206 A1* | 11/2007 | Yamazaki et al. | 257/347 |
| 2008/0258140 A1* | 10/2008 | Lee et al. | 257/43 |

* cited by examiner

*Primary Examiner* — David Vu  
*Assistant Examiner* — Caleb Henry

(57) ABSTRACT

Thin film transistors and circuits having improved mobility and stability are disclosed in this invention to have metal oxynitrides as the active channel layers. In one embodiment, the charge carrier mobility in the thin film transistors is increased by using the metal oxynitrides as the active channel layers. In another embodiment, a thin film transistor having a p-type metal oxynitride active channel layer and a thin film transistor having an n-type metal oxynitride active channel layer are fabricated to forming a CMOS circuit. In yet another embodiment, thin film transistor circuits having metal oxynitrides as the active channel layers are provided.

19 Claims, 3 Drawing Sheets

Fig. 1    100
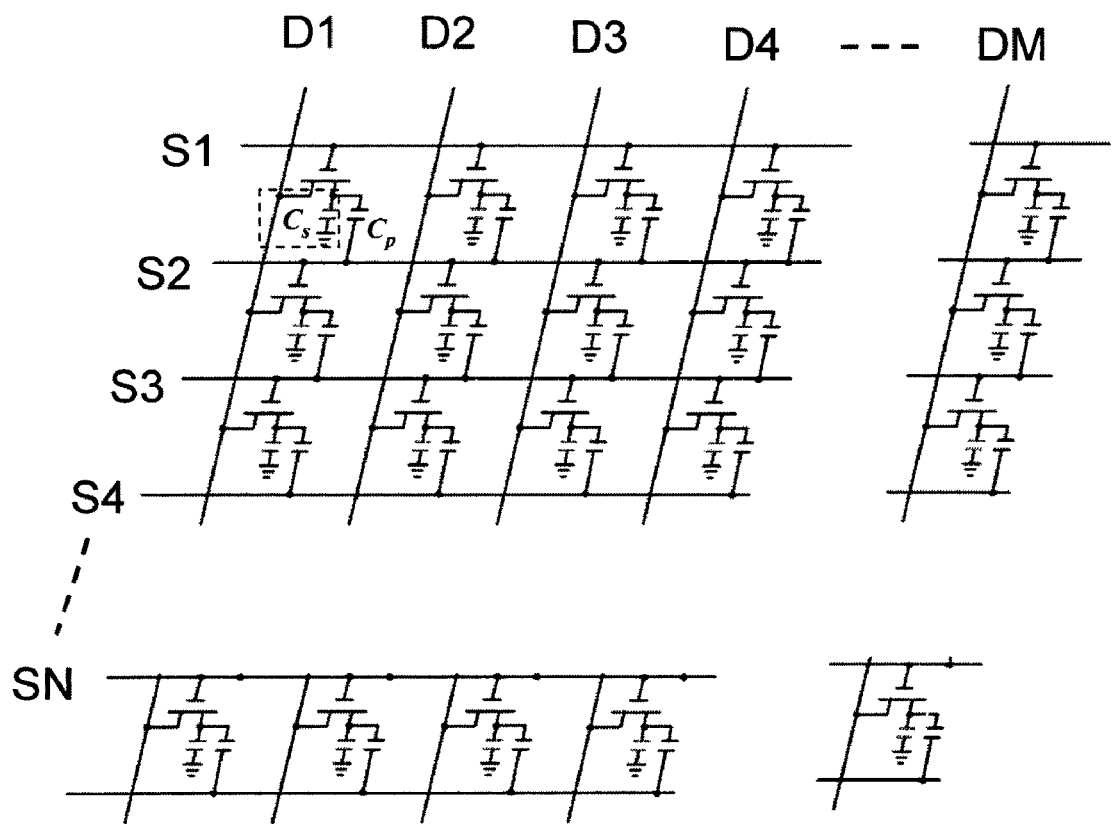

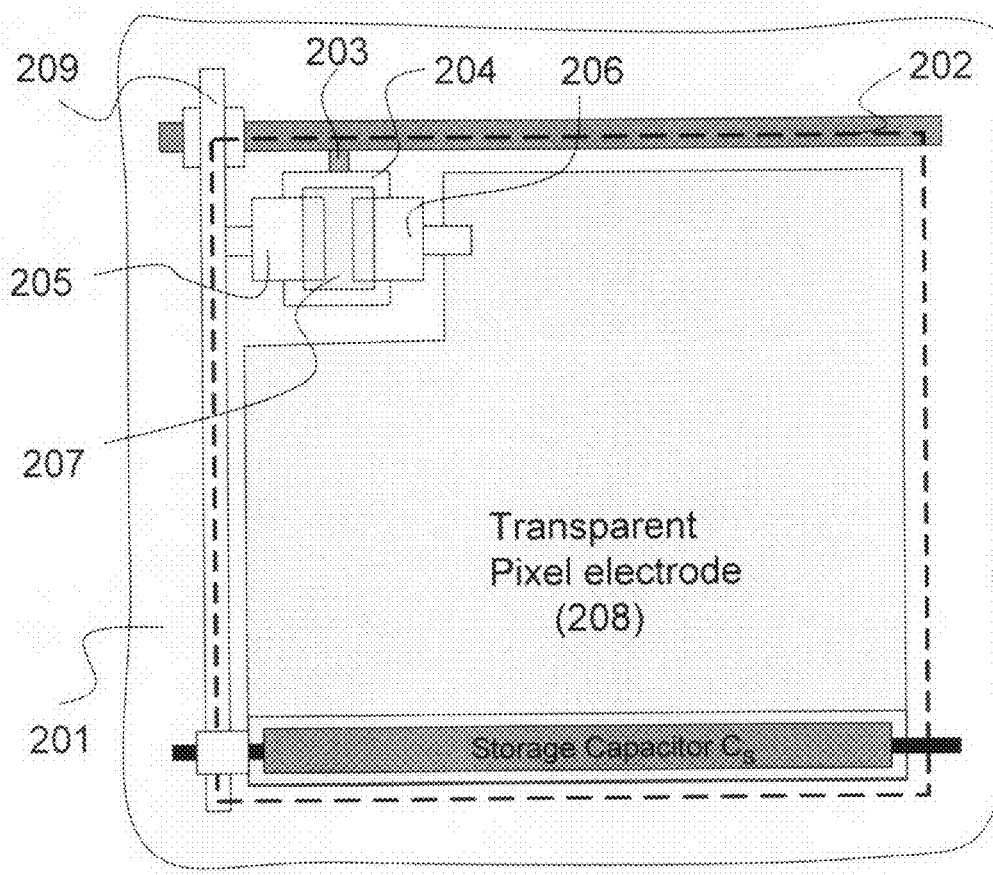
Fig. 2  200
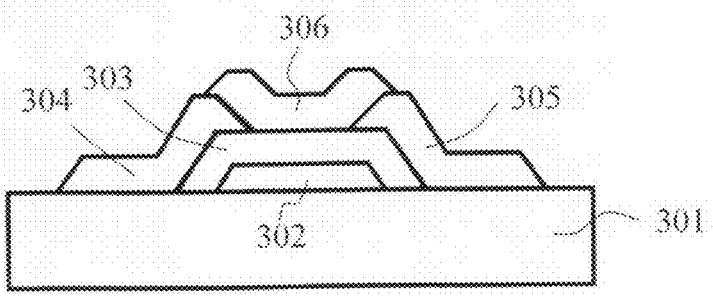
Fig. 3  300

Fig. 4    400
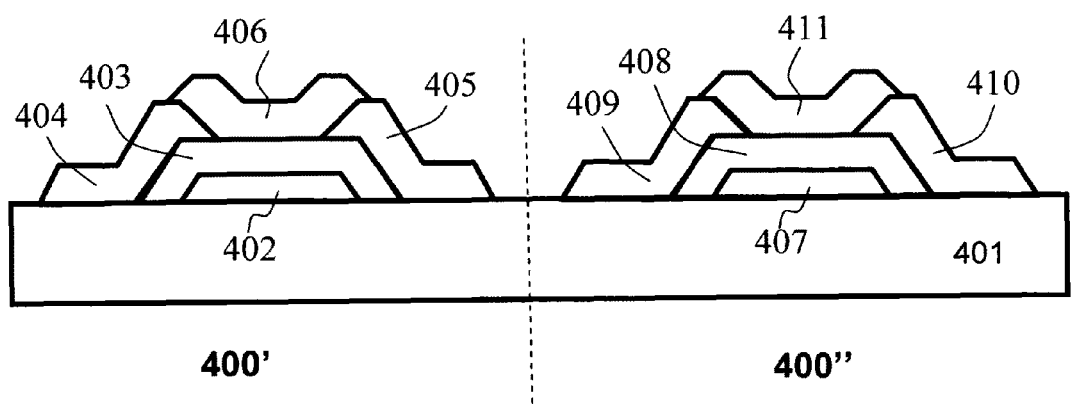
400'    400''
Fig. 5    500
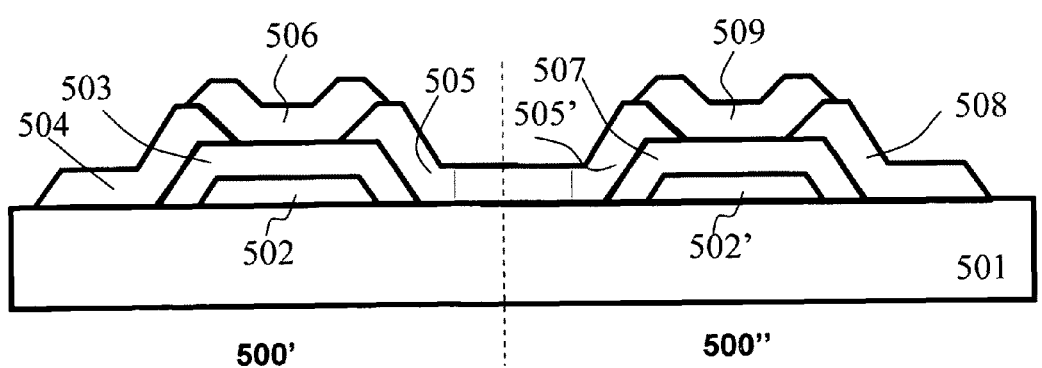
500'    500''

THIN FILM TRANSISTORS AND CIRCUITS WITH METAL OXYNITRIDE ACTIVE CHANNEL LAYERS

FIELD OF INVENTION

This invention is related to thin film transistors for electronic and optoelectronic applications. More specifically, it relates to a family of thin film transistors with metal oxynitride channel and a family of thin film transistor circuits with metal oxynitride channel for flat panel electronic display, imaging and microwave applications.

BACKGROUND OF THE INVENTION

In large area electronic circuits including active-matrix liquid crystal display (AM-LCD) technology, active-matrix organic light emitting displays (AM-OLED) and x-ray imagers, thin film transistors are used to form the switching circuits. For example, in an AM-LCD display, an array of TFTs are used as the active "switches", each TFT controls one of the pixels of the displays. As shown in FIG. 1, an LCD display (100) consists of a two dimensional array of pixels having data lines (D1-DM) and gate selection lines (S1-SN). A TFT is inserted between the gate selection line and the data line as an active switch to control the ON/OFF states of the pixel defined by the selection line and data line. The liquid crystal pixel has an equivalent capacitance $C_p$. One end of $C_p$ is connected to the drain of the TFT whereas the other end of it is connected to a ground line (in this case the next selection line).

During operation, the TFT behaves like a variable resistor with low ON state resistance $R_{ON}$ and high OFF state resistance $R_{OFF}$. The rise time of the pixel voltage when the TFT is turned on should be short while the hold time or charge retention time should be long. The short rise time is achieved by the low $R_{ON}$ value and the long retention time is achieved by the large $R_{OFF}$. In order to achieve long enough charge retention time, in many electronic displays, a storage capacitor $C_S$ with capacitance value substantially larger than that of the liquid crystal cell ($C_p$), is usually inserted into each pixel to minimize the unwanted fast discharging. As the main components in the backplanes of AM-LCDs, the device performance of TFTs often determines the quality of the displays, such as response times and contrast ratios. Therefore, the search for high performance TFTs has never stopped.

FIG. 2 shows an enlarged view of a pixel (200) in an AM-LCD display. There is a first substrate (201) with a gate select line (202) and gate electrode (203) deposited and patterned. The gate electrode (203) and gate select line (202) are connected electrically. A layer of gate insulator (204) is deposited to cover the gate metal (203) with a drain electrode (205) and a source electrode (206) formed on top of it. An active channel layer (207) is deposited to cover part of the gate insulator layer (204) and to overlap partly the source and drain electrodes. The source electrode (206) is connected to a transparent pixel electrode (208) which is conductive and optically transparent. The drain electrode (205) is connected to a data line (209). To form the LCD units, a second substrate (not shown) with a conductive and optically transparent layer is brought over the first substrate (201), with the conductive layer on the second substrate facing the first substrate where the TFT (200) and the transparent pixel electrodes (208) are deposited. Liquid crystal is introduced into the gap space between the firs substrate (201) and the second substrate.

Two most important parameters to the operation of a TFT are the response time and ON/OFF current ratio ($I_{ON}/I_{OFF}$).
The response time is mainly determined by the RC time constant for charging the pixel, which is equal to $R_{ON} \times C_S$ (where $R_{ON}$ is the ON state resistance of the TFT and $C_S$ is the capacitance of the storage capacitor). Value of $R_{ON}$ is determined by charge carrier mobility in the active channel layer (207) and the dimensions of the active channel of the TFTs. For TFTs with fixed channel dimensions, $R_{ON}$ is inversely proportional to the charge carrier mobility in the active channel layer (207). In TFTs with high charge carrier mobility, values of $R_{ON}$ decrease and the unwanted joule heating in the TFTs during operation will be reduced. In addition, when active channel layer with higher charge carrier mobility is used, the dimensions of TFTs may be reduced while the same $R_{ON} \times C_S$ value is maintained. When the dimensions of the TFTs are reduced, the area available for the transparent pixel electrode (208) will increase. As a direct result, the pixel aperture will increase to allow more light to pass through and the brightness of the displays will be increased. Therefore, it is advantageous to develop TFTs having active channel layer with high charge carrier mobilities. Furthermore, due to the reduction in $R_{ON}$ values with the increase in charge carrier mobilities of the active channel layer, data lines or selection lines having higher resistance (for example, due to the increase of the dimensions of the displays) can still be adopted to yield small enough $R_{ON} \times C_S$ values for normal operation. The advantages of having TFTs with high channel layer mobility thus include: [1] lower joule heating of the transistors (equal to $I_d^2 R_{ON}$, where $I_d$ is the drain current of the TFT), [2] higher switching speed, [3] larger display dimensions and more importantly [4] larger pixel aperture.

Thin Film Transistors (TFTs)

From the above description, TFT is a three terminal device consisting of a gate electrode, a source electrode and a drain electrode separated by a gate insulator. A thin layer of semiconductor deposited between the source and drain electrodes serves as the active channel region. Upon applying gate voltages, charge carriers can be induced into the channel and travel from source to drain under the influence of a lateral electric filed created by drain voltages, giving rise to a drain currents.

The first TFT was fabricated by P. K. Weimer in 1961 by using thin film cadmium sulfide (CdS) as the active channel semiconductor. Over the last few decades, TFT technology has been developed on several materials including cadmium selenide (CdSe, electron mobility ~10 $cm^2$/V-s), tellurium (Te, mobility value as high as ~100 $cm^2$/V-s). However, due to its large OFF state current and its poor thermal stability, the above materials were not used in mass productions for electronic products involving TFTs. The most successful TFT at the present time is based on amorphous silicon (a-Si) due to its mature technology and excellent yield in production. However, amorphous silicon has a relatively low charge carrier mobility (~1 $cm^2$/V-s), therefore, it suffers from relatively low circuit densities (low pixel aperture) and slow switching speeds because substrates are processed at relatively low temperature (<350° C.).

Extensive efforts have also been made in the last few decades to develop silicon (Si)-based TFTs with higher mobility. In order to increase the mobility, polycrystalline thin films have to be used. By switching amorphous Si to polycrystalline silicon (p-Si), TFTs with electron mobility exceeding 100 $cm^2$/V-s can be created. However, this requires either high temperature (>650° C.) crystallization or low temperature (<600° C.) laser annealing process. Because of the high processing temperatures, expensive substrates are needed to produce polycrystalline silicon TFTs for AM-LCDs, thus preventing this technology from being used in low cost production.

Metal Oxide TFTs

From the above description, it is evident that it is highly desirable to develop TFTs having high carrier mobility (as compared to amorphous silicon TFTs) and with low processing temperatures. Recently, there has been some development on a new class of TFTs utilizing metal oxides as the active channel materials. The metal oxides include indium oxide, zinc oxide, tin oxide, gallium oxide and their mixtures. For TFTs with metal oxides as the active channel materials, the advantages include low processing temperatures and higher charge carrier mobility. As mentioned before, by having higher charge carrier mobility values, dimensions of TFTs required for switching of liquid crystal or OLED pixels can be made smaller resulting in higher pixel aperture and shorter switching time. Due to the increase in the charge carrier mobility values, the new metal oxide TFTs are not only suitable for the switching of pixels in the conventional AM-LCDs but also ideal for driving pixels in organic light emitting diode arrays, which often require high operation currents.

Although the charge carrier mobility of the metal oxide TFTs is higher than that of the a-Si TFTs, the values (in the order of several tens of $cm^2$/V-sec) are still low as comparing to that of the monocrystalline silicon and polycrystalline silicon. Hence, even though TFTs made of these metal oxides are suitable for driving of LCDs and OLEDs displays, the resistance between the drain and the source electrodes in the ON state is still considered high and the unwanted joule heating in the active channel layer is sizeable. Furthermore, the charge carrier mobility of the metal oxides are not sufficiently high to form into devices and circuits for generating and manipulating of electrical signals in a frequency range from few tens of megahertz (MHz) to several gigahertz (GHz)—in the microwave range. If TFTs with charge carrier mobility in the order of several hundred $cm^2$/V-sec can be developed, switching circuits and devices with minimum unwanted joule heating may be realized and power consumption for the operation of such circuits may be minimized. In addition, advanced TFTs circuits required for microwave signals may be fabricated on low cost substrates such as glass and plastic over a large area. In this manner, the manufacturing cost for the switching circuits and high frequency circuits may be reduced significantly.

OBJECTIVES OF THE INVENTION

One object of this invention is to provide a new class of TFTs and circuits with metal oxynitrides as the active channel materials to increase the charge carrier mobility and switching speed.

One other object of this invention is to provide a new class of TFTs and circuits with metal oxynitrides as the active channel materials to reduce the joule heating during switching and to improve thermal stability.

Another object of this invention is to provide TFTs and circuits of metal oxynitrides active channel to reduce the deposition temperature.

Still another object of this invention is to provide a new class of TFTs and circuits with metal oxynitrides as the active channel materials to increase the frequency of operation.

Yet another object of this invention is to provide a new class of TFTs and circuits of metal oxynitrides active channel layer with controllable conducting type.

BRIEF DESCRIPTION OF THE DRAWINGS

FIG. 1 a schematic diagram showing active-matrix addressing scheme with N rows and M columns.

FIG. 2 a top view illustrates a typical layout of one pixel in an active-matrix liquid crystal display (AM-LCD).

FIG. 3 a simplified schematic illustration shows a bottom gate thin film transistor (300) with a metal oxynitride active channel layer (306).

FIG. 4 a schematic diagram depicts two thin films metal oxynitride transistors fabricated on the same substrate, one is n-channel TFT and the other is p-channel TFT.

FIG. 5 a schematic diagram shows a CMOS circuit (500) with two metal oxynitride thin film transistors, one with a n-type active channel and the other with a p-type active channel.

DETAILED DESCRIPTION OF THE INVENTION

TFTs With Metal Oxynitride Active Channels

According to one embodiment of this invention, a thin film transistor (300) is provided (as illustrated in FIG. 3) to have a substrate (301), a first gate electrode (302), a first gate insulator (303), a drain (304), a source (305) and a first metal oxynitride active channel layer (306). In TFT (300), said first gate insulating layer (303) overlaps at least a portion of said first gate electrode (302); said source electrode (304) overlaps a first potion of said first gate insulating layer (303); said drain electrode (304) overlaps a second portion of said first gate insulating layer (303). Said first metal oxynitride active channel layer (306) overlaps a portion of said first gate insulating layer (303), at least a portion of said source electrode (304) and at least a portion of said drain electrode (305) so that a continuous conducting channel may be induced to connect said drain and source electrodes when a voltage is applied to said gate electrode (302). As an alternate embodiment, said metal oxynitride active channel layer may be placed on said first gate insulator with the drain and source on top and overlapping a first portion and a second portion of said active channel layer. There is also a first passivation layer (not shown) cover said TFT for protection of said active channel layer.

Generally, metal nitrides have higher charge carrier mobility than their counter part: metal oxides. For instance, dependent on the deposition and treatment conditions, room temperature electron mobility of indium oxide ($In_2O_3$) varies from 10 to 100 $cm^2$/V-sec with a typical value of about 20 $cm^2$/V-sec while electron mobility of single crystalline indium nitride (InN) can be greater than 1,000 $cm^2$/V-sec in thin film form and can be as high as 3,500 $cm^2$/V-sec when prepared under optimum conditions. When deposited in thin film form, zinc oxide has a typical room temperature mobility of about 25 $cm^2$/V-sec whereas it is about 100 $cm^2$/V-sec for zinc nitride. Therefore, it is clear from this invention that by substituting partially the oxygen content with nitrogen content, the charge carrier mobility of a TFT can be made significantly larger. Hence, according to one embodiment of this invention, substituting the metal oxides with metal oxynitrides for the active channel layer (306) can enhance greatly the charge carrier mobility of a TFT with the exact value determined by the deposition conditions including deposition rate, substrate temperature, stoichiometry (including nitrogen to oxygen ratio) of the film and subsequent treatment. However, it is noted that since silicon oxide and germanium oxide are relatively non-conducting and hence the amount of these materials to be included in the said first metal oxynitride active channel layer (306) should be limited to a small value, such as 1%.

Materials for said first substrate (301) are selected from a group comprising: glass substrate, silica substrates, plastic sheets, metallic sheet with dielectric coating, ceramic substrates and semiconducting substrates with dielectric coatings. Materials of said first metal oxynitride active channel layer (306) are selected from a group of metal oxynitrides including indium oxynitride, zinc oxynitrides, tin oxynitrides, gallium oxynitrides, titanium oxynitride, germanium oxynitrides, silicon oxynitrides and their combinations. Said first gate insulator (303) is selected from a material group consists of silicon dioxide, silicon nitride, aluminum oxide, aluminum nitride, hafnium oxide, strontium titanate, and their combinations. Whereas materials of said first gate electrode (302), said drain electrode (304) and said source electrodes (305) are selected from a group containing Ti, W, Mo, Ta, Al, Nb, Ni, Al, Cu and their alloys and conducting transparent oxides (CTO). Therefore, it will become evident to those skilled in the art, the selection of materials for the first gate electrode (302), first gate insulator (303), drain (304) and source (305) is determined by the type of metal oxynitrides for said first metal oxynitride active channel layer (306) in a manner to have minimum leakage current through said first gate insulator (303) and low contact resistance between said first metal oxynitride active channel (306) and said source electrodes (305) when said TFT (300) is turned on.

Since the charge carrier mobility in the present oxynitrides is higher than that in pure metal oxides, the unwanted joule heating within the active channels of the TFTs during switching will be significantly less than that in conventional TFT circuits involving amorphous silicon or conventional metal oxides.

The first metal oxynitride active channel layer (306) is formed by a method selected from a group including thermal evaporation, reactive evaporation in the presence of gases such as a mixture of oxygen and nitrogen, dc sputtering, rf sputtering in the presence of gases such as a mixture of oxygen and nitrogen in addition to conventional argon, CVD and PECVD etc. The deposition can be carried out without intentional substrate heating and followed by a post-deposition annealing. Alternately, the deposition may be performed with a substrate heating at temperatures below 400° C. and preferably below 350° C. In order to improve the characteristics of TFTs, metal oxynitrides other than indium oxynitride, including zinc oxynitrides, tin oxynitride, gallium oxynitrides, silicon oxynitrides, titanium oxynitride, and germanium oxynitrides may be adopted.

According to another embodiment of this invention, a first passivation layer can advantageously deposited over TFT (300) for protection and to provide stability. Materials of said first passivation layer may be selected from silicon oxide and silicon nitride and their mixture in order to protect said active channel and improve its thermal stability.

Although the above description has been made in reference to a bottom-gate TFT structure, it is equally feasible to adopt a top-gate TFT structure for the present devices having a metal oxynitride active channel layer. Hence, a thin film transistor containing a first metal oxynitride active channel layer having a top-gate structure is provided for forming a switching array or a circuit according to this invention. In such structure, said first metal oxynitride active channel layer is deposited on a first substrate. A first gate insulating layer is then deposited over said first metal oxynitride active channel layer. A source electrode overlapping and contacting a first portion of said first metal oxynitride active channel layer and a drain electrode overlapping and contacting a second portion of said first metal oxynitride active channel layer are deposited. Finally, a first gate insulating layer and a first gate electrode layer are deposited sequentially with said first gate electrode overlapping at least a portion of said first gate insulating layer, forming a top-gate thin film transistor structure having a metal oxynitride channel layer.

According to yet another embodiment of this invention, the length of said first active channel layer or the distance between said drain (304) and source (305) is substantially less than 1 micrometer so that the transit time of charge carriers from source (305) to drain (304) and the gate capacitance (between said first gate electrode and drain electrode) are small for switching at microwave frequencies. In order to minimize the unwanted capacitance between said first gate electrode and said drain, overlap between them is kept as small as possible. Hence according to this invention, short channel metal oxynitride TFTs are provided for microwave signals. Due to higher charge carrier mobility and lower process temperature, they may be fabricated on low cost substrates such as glass and plastic over a large area. In this manner, the manufacturing cost for the switching circuits and high frequency circuits may be reduced significantly.

According to one other embodiment of this invention, the charge carrier mobility of a TFT can be increased by adjusting the nitrogen content or the nitrogen to oxygen ratio in said metal oxynitride active channel layer (306).

TFTs With Mixtures of Metal Oxynitrides:

In accordance to one embodiment of the present invention, mixtures of two or more of above-mentioned oxynitrides may be advantageously deposited to form the first active channel (306) of TFT (300) in order to improve performance and stability of the TFT. For example, when incorporating silicon oxynitrides or germanium oxynitrides into the first active channel layer (306), the thermal stability of the TFTs may be improved. However, the concentrations of the silicon oxynitrides or germanium oxynitrides should be kept less than 5% in order to avoid the unwanted decrease in the charge carrier mobility. The following examples are given for demonstration purposes only.

(1) A mixture having 60 at % indium oxynitrides and 40 at % zinc oxynitride as the first channel layer is deposited to a thickness of 50 nm on a first gate insulator in an atmosphere containing 35% nitrogen and 15% oxygen and 50% argon.

(2) Another example is a mixture of metal oxynitrides as the first channel layer including: 60% zinc oxynitrides and 40% tin oxynitrides.

(3) Yet another example is a mixture of metal oxynitrides including: 60 zinc oxynitrides, 20 tin oxynitrides and 20% gallium oxynitrides as the first channel layer.

Metal Oxynitride TFTs For OLED Display

In FIG. 2, a schematic diagram of an LCD pixel has been shown with a single TFT acting as a switch. During the scanning, charges are allowed to flow to the storage capacitor $C_S$ to sustain the potential for controlling the orientation of liquid crystals in the pixel. The charges in the storage capacitor $C_S$ can be maintained during the frame time in order to maintain the pixel light intensity. For a light emitting pixel such as OLED, there is a need to have continuous current flow during the frame time in order to maintain the emission light intensity. Therefore, a single first TFT for the pixel is not sufficient for the operation of an OLED as the charges initially stored in the storage capacitor $C_S$ will decrease rapidly due to the flow of current. In the pixel circuits, there is at least a second TFT with the gate connected to the drain of the first TFT. The source of the second TFT is connected directly to a power supply line to receive a current to maintain the illuminating ON state for the OLED. Therefore, the driving pixel circuit for OLED displays may be conveniently implemented using a first metal oxynitride TFT and a second metal oxynitride TFT according to this invention forming a single pixel to achieve the advantages of decrease in un unwanted joule heating and switching time, increase in pixel aperture. Since the charge carrier mobility is higher than that in amorphous silicon and pure metal oxide, the unwanted joule heating within the active channels of the TFTs during switching will be significantly less than that in conventional TFT circuits involving amorphous silicon or conventional metal oxides. For those skilled in the art, it will become evident to employ more than two metal oxynitride TFTs to form a pixel. Furthermore, it is also evident that said metal oxynitride TFTs may have a single-channel, a double-channel and triple-channel structure.

Control of Conduction Type of Active Channel Layer by Controlling the Nitrogen Content in Metal Oxynitrides When the nitrogen content in metal oxynitrides is increased to higher level, the conductivity type may change from n-type to p-type. This will occur in metal oxynitrides containing large amount of zinc. According to an embodiment of this invention, a first active channel layer having p-type conduction is formed by metal oxynitrides containing more than 90% of zinc nitride and 10% zinc oxide and deposited in an environment containing high concentration of nitrogen. After deposition of the first metal oxynitride active channel layer, an anneal step must be carried out in order to activate the acceptors in the metal oxynitrides. Such TFTs with p-type first channel layer have charge carrier mobility in the order of 10 to 100 $cm^2$/V-sec.

It is sometimes desirable to have both n-channel TFTs and p-channel TFTs fabricated on the same substrates in order to form circuits with enhanced functionality. According to the present invention, metal oxynitride active channels of TFTs on the same substrate are formed to have different conducting types. In a first portion, TFTs are formed in such a manner so that they have n-type conducting active channels whereas in a second portion, TFTs are formed in a different manner so that they have p-type conducting active channels. FIG. 4 shows two transistors (400) fabricated on a first substrate (401), a first TFT (400') is p-channel and a second TFT (400") is n-channel. The p-channel first TFT (400') consists of a first gate electrode (402), a first gate insulator (403), a first drain electrode (404), a first source electrode (405), and a first active channel (406) of p-type. The n-channel second TFT (400") consist of a second gate electrode (407), a second gate insulator (408), a second drain electrode (409), a second source electrode (410), and a second active channel (411) of n-type. It is also advantageous to have a first passivation layer for protection of said first TFT (400') and a second passivation layer for protection of said second TFT (400").

Complementary Metal Oxynitrides Metal-Oxide-Semiconductor (CMOS) Circuits

CMOS is a major class of integrated circuits widely used in microprocessors and digital circuits. It is also used for analog circuit applications such as read out circuit of imaging sensors. When both n-type and p-type semiconductors can be produced using metal oxynitride with different compositions, CMOS circuitry with one n-channel TFT and one p-channel TFT can be formed on a single substrate.

FIG. 5 shows a CMOS circuit (500) fabricated on substrate (501), having a first TFT (500') with a p-channel and a second TFT (500") with an n-channel. The first p-channel TFT (500') consists of a first gate electrode (502), a first gate insulator (503), a first source electrode (504), a first drain electrode (505), and a first p-type metal oxynitride active channel (506). The second n-channel TFT (500") consist of a second gate electrode (502') that is interconnected to said first gate electrode (502), a second gate insulator (507), a second drain electrode (505') that is interconnected to said first drain electrode (505), a second source electrode (508), and a second n-type metal oxynitride active channel (509). To complete the CMOS circuit, a first passivation layer for protection of said first TFT (500') and a second passivation layer for protection of said second TFT (500") are deposited.

Both the first p-type metal oxynitride active channel (506) and the second n-type metal oxynitride active channel (509) are selected from a material group comprising indium oxynitride, zinc oxynitrides, tin oxynitrides, gallium oxynitrides, germanium oxynitrides, silicon oxynitrides, titanium oxynitride, germanium oxynitrides and their combinations. The conducting type of the metal oxynitride active channel layer is controlled by controlling the oxygen to nitrogen ratio and its stoichiometry. All electrodes may be selected from a group of transparent conducting oxides (TCO), Ti, W, Mo, Ta, Al, Nb, Ni, Al, Cu and their mixtures.

Circuits of Metal Oxynitride Thin Film Transistor With Improved Charge Carrier Mobility In accordance to yet another embodiment of this invention, there is formation of a plurality of p-channel TFTs on a first substrate with first p-type metal oxynitrides as the first channel layers and then formation a plurality of n-channel TFTs on said first substrate with second n-type metal oxynitrides as the second channel layers of said n-channel TFTs. Said first p-type metal oxynitrides are selected from a group of indium oxynitride, zinc oxynitrides, tin oxynitrides, titanium oxynitride, gallium oxynitrides, silicon oxynitrides, germanium oxynitrides and their combinations and deposited to form into p-type conduction by controlling ratio of oxygen to nitrogen and stoichiometry. Whereas said second metal oxynitrides are selected from a group of indium oxynitride, zinc oxynitrides, tin oxynitrides, gallium oxynitrides, silicon oxynitrides, titanium oxynitride, germanium oxynitrides and their combinations to form into n-type conduction by controlling ratio of oxygen to nitrogen and stoichiometry. Said electrodes may be selected from a group of transparent conducting oxides (TCO), Ti, W, Mo, Ta, Al, Nb, Ni, Al, Cu and their mixtures.

Although the above description has been made in reference to a bottom gate TFT structure, it is equally feasible to adopt a top gate, TFT structure for the present devices. According to yet another embodiment of this invention, a first passivation layer can advantageously deposited over said metal oxynitride thin film transistor circuits for protection and to provide stability. Materials of said first passivation layer may be selected from silicon oxide and silicon nitride and their mixture in order to protect said first p-type active channels and second n-type active channels and improve the thermal stability of said metal oxynitride thin film transistor circuits.

What is claimed is:

1. A manufacture method of a metal oxynitride thin film transistor with improved charge carrier mobility comprising the steps of:
   providing a first substrate;
   forming a first gate electrode over said first substrate;
   forming a first gate insulating layer, said first gate insulating layer overlaps at least a portion of said first gate electrode;
   forming a source electrode, said source electrode overlaps a first portion of said first gate insulating layer;
   forming a drain electrode, said drain electrode overlaps a second portion of said first gate insulating layer; and
   forming at least a first metal oxynitride active channel layer, said first metal oxynitride active channel layer overlaps at least a portion of said first gate insulating layer, at least a portion of said source electrode and at least a portion of said drain electrode, wherein said charge carry mobility of said first metal oxynitride active channel layer is controlled by controlling metal content and nitrogen to oxygen ratio in said first metal oxynitride active channel layer during said active channel layer deposition.

2. A manufacture method of a metal oxynitride thin film transistor with improved charge carrier mobility as defined in claim 1, wherein said first substrate is selected from a group comprising: glass substrate, silica substrates, plastic sheets, metallic sheet with dielectric coating, ceramic substrates and semiconducting substrates with dielectric coating.

3. A manufacture method of a metal oxynitride thin film transistor with improved charge carrier mobility as defined in claim 1, wherein material of said metal oxynitride active channel layer is selected from a group comprising: indium oxynitride, zinc oxynitride, tin oxynitride, gallium oxynitride, titanium oxynitride, germanium oxynitride, silicon oxynitride and their mixtures.

4. A manufacture method of a metal oxynitride thin film transistor with improved charge carrier mobility as defined in claim 1, wherein said first metal oxynitride active channel layer is formed by a method comprising: thermal evaporation, reactive evaporation, sputtering, reactive sputtering, CVD, and PECVD.

5. A manufacture method of a metal oxynitride thin film transistor with improved charge carrier mobility as defined in claim 1, wherein said charge carrier mobility of said metal oxynitride active channel layer is further controlled by deposition conditions and post thermal treatment of said first metal oxynitride active channel layer.

6. A manufacture method of a metal oxynitride thin film transistor with improved charge carrier mobility as defined in claim 1, wherein conducting type of said metal oxynitride active channel layer is controlled by adjusting metal content and nitrogen to oxygen ratio in said first metal oxynitride active channel layer during said active channel layer deposition.

7. A manufacture method of a metal oxynitride thin film transistor with improved charge carrier mobility as defined in claim 1, wherein said first gate insulating layer is a material selected from a group of silicon dioxide, silicon nitride, aluminum oxide, aluminum nitride, hafnium oxide, strontium titanate, and their combinations.

8. A manufacture method of a metal oxynitride thin film transistor with improved charge carrier mobility as defined in claim 1, further comprising a step of forming a passivation layer for protection of said first metal oxynitride active channel layer.

9. A manufacture method of a CMOS circuit with improved charge carrier mobility comprising the steps of:
    forming a first p-channel metal oxynitride thin film transistor having at least a p-type metal oxynitride active channel layer, a first gate electrode, a first gate insulator, a first source electrode, and a first drain electrode, said charge carrier mobility of said p-type metal oxynitride active channel layer is controlled by controlling metal content and nitrogen to oxygen ratio in said p-type metal oxynitride active channel layer during said p-type active channel layer deposition, and
    forming a second n-channel metal oxynitride thin film transistor having at least a n-type metal oxynitride active channel layer, a second gate electrode, a second gate insulator, a second source electrode, and a second drain electrode, said charge carrier mobility of said n-type metal oxynitride active channel layer is controlled by controlling metal content and nitrogen to oxygen ratio in said n-type metal oxynitride active channel layer during said n-type active channel layer deposition,
wherein said first gate electrode is connected to said second gate electrode and first drain electrode is connected to said second drain electrode.

10. A manufacture method of a CMOS circuit with improved charge carrier mobility as defined in claim 9, wherein material of said p-type and n-type metal oxynitride active channel layer is selected from a group comprising: indium oxynitride, zinc oxynitride, tin oxynitride, gallium oxynitride, titanium oxynitride, germanium oxynitride, silicon oxynitride and their mixtures.

11. A manufacture method of a CMOS circuit with improved charge carrier mobility as defined in claim 9, wherein conducting type of said p-channel and n-channel is controlled by controlling metal content and oxygen to nitrogen ratio of said metal oxynitride active channel layer during said active channel layer deposition.

12. A manufacture method of a CMOS circuit with improved charge carrier mobility as defined in claim 9, further comprising a step of forming a first passivation layer for protection of said p-type metal oxynitride active channel layer and a second passivation layer for protection of said n-type metal oxynitride active channel layer.

13. A manufacture method of a circuit of metal oxynitride thin film transistors with improved charge carrier mobility comprising the steps of forming a plurality of thin film transistors, each with at least a metal oxynitride active channel layer, wherein said charge carrier mobility of said plurality of thin film transistors is controlled by controlling metal content and oxygen to nitrogen ratio in each said metal oxynitride active channel layer during said active channel layer deposition.

14. A manufacture method of a circuit of metal oxynitride thin film transistors with improved charge carrier mobility as defined in claim 13, wherein material of said metal oxynitride active channel layer is selected from a group comprising: indium oxynitride, zinc oxynitride, tin oxynitride, gallium oxynitride, titanium oxynitride, germanium oxynitride, silicon oxynitride and their mixtures.

15. A manufacture method of a circuit of metal oxynitride thin film transistors with improved charge carrier mobility as defined in claim 13, where conducting type of each said metal oxynitride active channel layer of said thin film transistors is controlled by controlling metal content and oxygen to nitrogen ratio of said each metal oxynitride active channel layer.

16. A manufacture method of a circuit of metal oxynitride thin film transistors with improved charge carrier mobility as defined in claim 13, said circuit is for optical sensor.

17. A manufacture method of a circuit of metal oxynitride thin film transistors with improved charge carrier mobility as defined in claim 13, said circuit is for rf identification tag applications.

18. A manufacture method of a circuit of metal oxynitride thin film transistors with improved charge carrier mobility as defined in claim 13, said circuit is for microwave applications.

19. A manufacture method of a circuit of metal oxynitride thin film transistors with improved charge carrier mobility as defined in claim 13, said circuit is for electronic displays.

* * * * *